US012567561B2

(12) United States Patent
Moalem et al.

(10) Patent No.: US 12,567,561 B2
(45) Date of Patent: Mar. 3, 2026

(54) HIGH-POWER DENSITY RF REMOTE PLASMA SOURCE APPARATUS

(71) Applicant: Applied Materials, Inc., Santa Clara, CA (US)

(72) Inventors: Mehran Moalem, Fremont, CA (US); Kartik Ramaswamy, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 428 days.

(21) Appl. No.: 17/874,929

(22) Filed: Jul. 27, 2022

(65) Prior Publication Data

US 2023/0060529 A1 Mar. 2, 2023

Related U.S. Application Data

(60) Provisional application No. 63/238,623, filed on Aug. 30, 2021.

(51) Int. Cl.
H01J 37/32 (2006.01)
(52) U.S. Cl.
CPC ...... H01J 37/321 (2013.01); H01J 37/32357 (2013.01); H01J 37/3244 (2013.01)

(58) Field of Classification Search
CPC . H01J 37/3244; H01J 37/32357; H01J 37/321
See application file for complete search history.

(56) References Cited

U.S. PATENT DOCUMENTS

| | | | |
|---|---|---|---|
| 7,159,597 B2 | 1/2007 | Hua et al. | |
| 7,431,795 B2 | 10/2008 | Kumar et al. | |
| 10,224,210 B2 | 3/2019 | Lubomirsky | |
| 10,573,496 B2 | 2/2020 | Lubomirsky | |
| 10,593,560 B2 | 3/2020 | Cho et al. | |
| 2003/0029475 A1 | 2/2003 | Hua et al. | |
| 2003/0085205 A1* | 5/2003 | Lai .................. | H01J 37/32431 |
| | | | 219/121.52 |
| 2004/0000321 A1 | 1/2004 | Cui et al. | |
| 2006/0118240 A1 | 6/2006 | Holber et al. | |
| 2006/0226119 A1 | 10/2006 | Kannan et al. | |
| 2009/0277874 A1 | 11/2009 | Rui et al. | |
| 2009/0302002 A1 | 12/2009 | Collins et al. | |
| 2019/0272999 A1 | 9/2019 | Cho et al. | |

* cited by examiner

*Primary Examiner* — Yuechuan Yu
(74) *Attorney, Agent, or Firm* — Schwabe, Williamson & Wyatt, P.C.

(57) ABSTRACT

Embodiments disclosed herein include a plasma source. In an embodiment, the plasma source includes a plurality of plasma legs connected to each other by corner connectors. In an embodiment, each plasma leg comprises a conductive shell, a magnetic layer around the conductive shell, and a primary coil in the magnetic layer.

18 Claims, 6 Drawing Sheets

HIGH-POWER DENSITY RF REMOTE PLASMA SOURCE APPARATUS

CROSS-REFERENCE TO RELATED APPLICATIONS

This application claims the benefit of U.S. Provisional Application No. 63/238,623, filed on Aug. 30, 2021, the entire contents of which are hereby incorporated by reference herein.

BACKGROUND

1) Field

Embodiments of the present disclosure pertain to the field of semiconductor processing and, in particular, to remote plasma systems for generating high-power and high-density microwave plasmas.

2) Description of Related Art

Semiconductor deposition systems require frequent chamber cleaning to clear buildup of material on the chamber walls. The most efficient process typically used includes an $NF_3$ remote plasma clean. In such cleaning processes, the $NF_3$ is broken down in the plasma to generate atomic fluorine. The atomic fluorine flows from the remote plasma source to the chamber. Atomic fluorine is highly reactive and reacts with the material deposited on the chamber walls to form a volatile product that can be removed through a vacuum exhaust system. Typically, such remote plasma cleaning processes require high power and high flow rates of the $NF_3$ due to low utilization rates. Accordingly, the process can be expensive and wasteful.

SUMMARY

Embodiments disclosed herein include a plasma source. In an embodiment, the plasma source includes a plurality of plasma legs connected to each other by corner connectors. In an embodiment, each plasma leg comprises a conductive shell, a magnetic layer around the conductive shell, and a primary coil in the magnetic layer.

Embodiments disclosed herein may also comprise a toroidal remote plasma source. In an embodiment, the toroidal remote plasma source comprises a first plasma leg, a second plasma leg coupled to the first plasma leg by a first corner connector, a third plasma leg coupled to the second plasma leg by a second corner connector, and a fourth plasma leg coupled to the third plasma leg by a third corner connector. In an embodiment, the fourth plasma leg is also coupled to the first plasma leg by a fourth corner connector.

Embodiments disclosed herein also comprise a plasma processing tool. In an embodiment, the plasma processing tool comprises a chamber, and a remote plasma source coupled to the chamber. In an embodiment, the remote plasma source comprises a plurality of plasma legs connected to each other by corner connectors. In an embodiment, each plasma leg comprises a conductive shell, a magnetic layer around the conductive shell, and a primary coil in the magnetic layer.

DETAILED DESCRIPTION

Remote plasma systems for generating high-power and high-density microwave plasmas are described herein. In the following description, numerous specific details are set forth in order to provide a thorough understanding of embodiments of the present disclosure. It will be apparent to one skilled in the art that embodiments of the present disclosure may be practiced without these specific details. In other instances, well-known aspects are not described in detail in order to not unnecessarily obscure embodiments of the present disclosure. Furthermore, it is to be understood that the various embodiments shown in the Figures are illustrative representations and are not necessarily drawn to scale.

As noted above, plasma cleaning processes typically utilize remote plasma systems. However, existing systems are limited in gas utilization efficiency and require high power to achieve a desired gas breakdown efficiency. Accordingly, embodiments disclosed herein include remote plasma sources that have improved gas utilization efficiency and require lower power for the same breakdown efficiency. In an embodiment, the RF energy is focused to a smaller volume than in standard remote plasma systems. The focusing of the energy results in an increase in the power density. Improved power density enables a more efficient process and better dissociating efficiency in breaking feed gasses into radical species. Accordingly, remote plasma systems disclosed herein require lower power for the same breakdown efficiency, lower flow rates of gas into the remote plasma system, and lower costs for equipment and consumables.

In a particular embodiment, the remote plasma system is a toroidal plasma assembly. The toroidal plasma assembly includes four legs (top, bottom, and sides) where plasma is generated in each leg. The four plasma legs may be coupled together by grounded corner fittings. Each leg may include a primary coil in order to induce the plasma. The current through each primary coil may be controlled in order to modify the plasma characteristics. Additionally, the primary coils may be electrically in parallel, electrically in series, or some combination of electrically in parallel and electrically in series. Additionally, the gas inlet and gas outlet may be oriented at different locations. In one embodiment, the gas inlet is centered on the top plasma leg and the gas outlet is centered on the bottom plasma leg. Such an embodiment may provide more symmetric gas flow through the remote plasma source. In other embodiments, the gas inlet and the gas outlet may be connected to the grounded corner fittings. Such an embodiment may provide ease of assembly since the inlet and outlet do not need to pass through the magnetic core and primary coil of each plasma leg.

Figure 1:
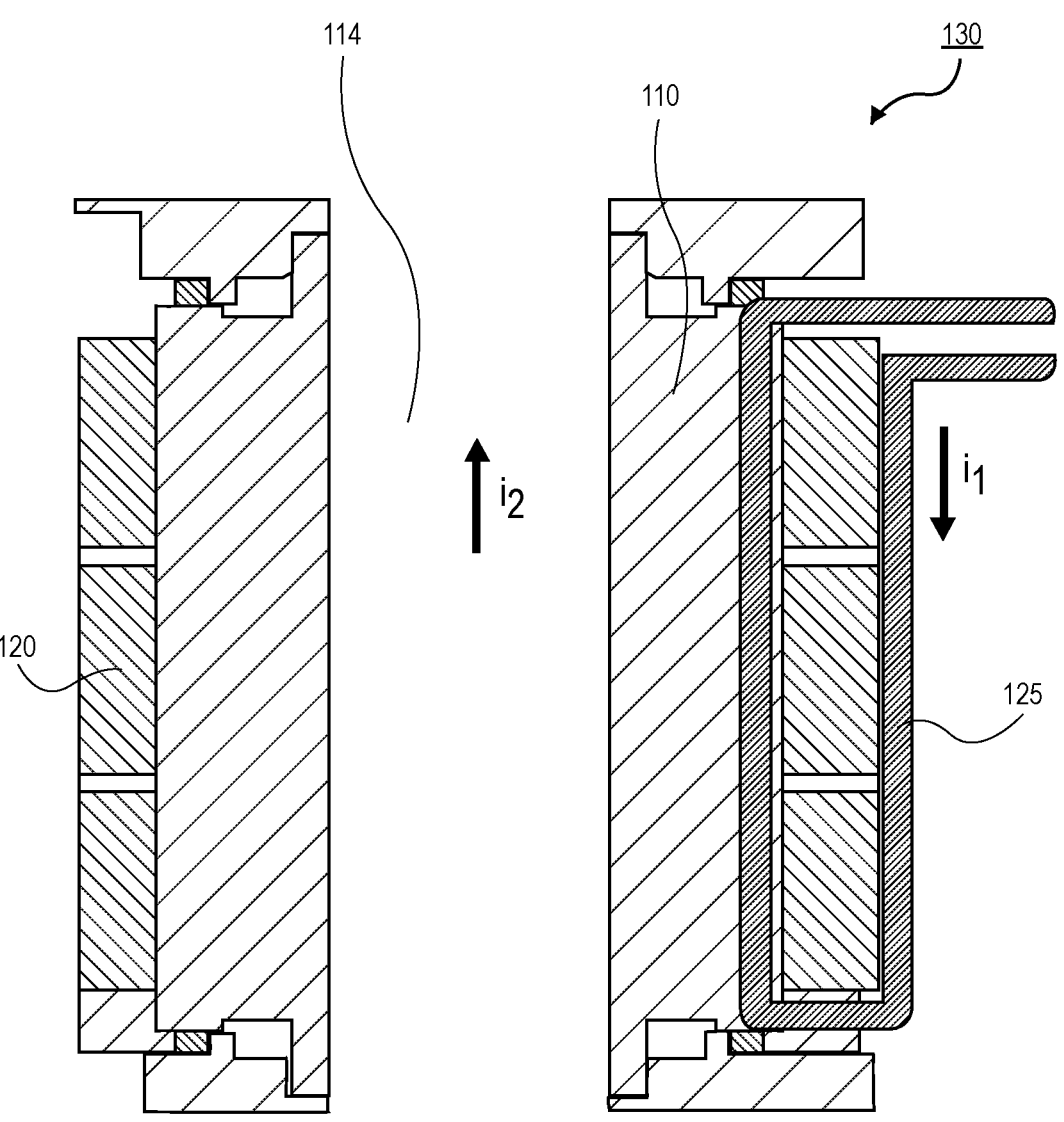
FIG. 1 is a cross-sectional illustration of a plasma leg in a toroidal plasma source, where the plasma leg comprises a conductive shell, a magnetic layer, and a primary coil, in accordance with an embodiment.

Referring now to FIG. 1, a cross-sectional illustration of a single leg 130 of a toroidal remote plasma system is shown, in accordance with an embodiment. In an embodiment, the plasma leg includes a conductive shell 110 with a top opening and a bottom opening. A plasma zone 114 may be provided within the conductive shell 110. In an embodiment, a magnetic layer 120 is provided around the conductive shell 110. The magnetic layer 120 may be any suitable magnetic material, such as a ferrite. It is to be appreciated that a plasma may be struck in the plasma zone 114 within the conductive shell 110. The magnetic layer 120 helps to confine the generated plasma in the volume 114. For example, a microwave induced plasma may be struck within the plasma zones 114. A primary coil 125 may be provided through the magnetic layer 120. The primary coil 125 may be supplied a current $i_1$ to induce the plasma. A secondary current $i_2$ may be generated in the plasma zone 114 as indicated by the arrow. In an embodiment, the conductive shell 110 is configured to be at a floating voltage. In other embodiments, the conductive shell 110 may be held at a desired voltage.

Figure 2:
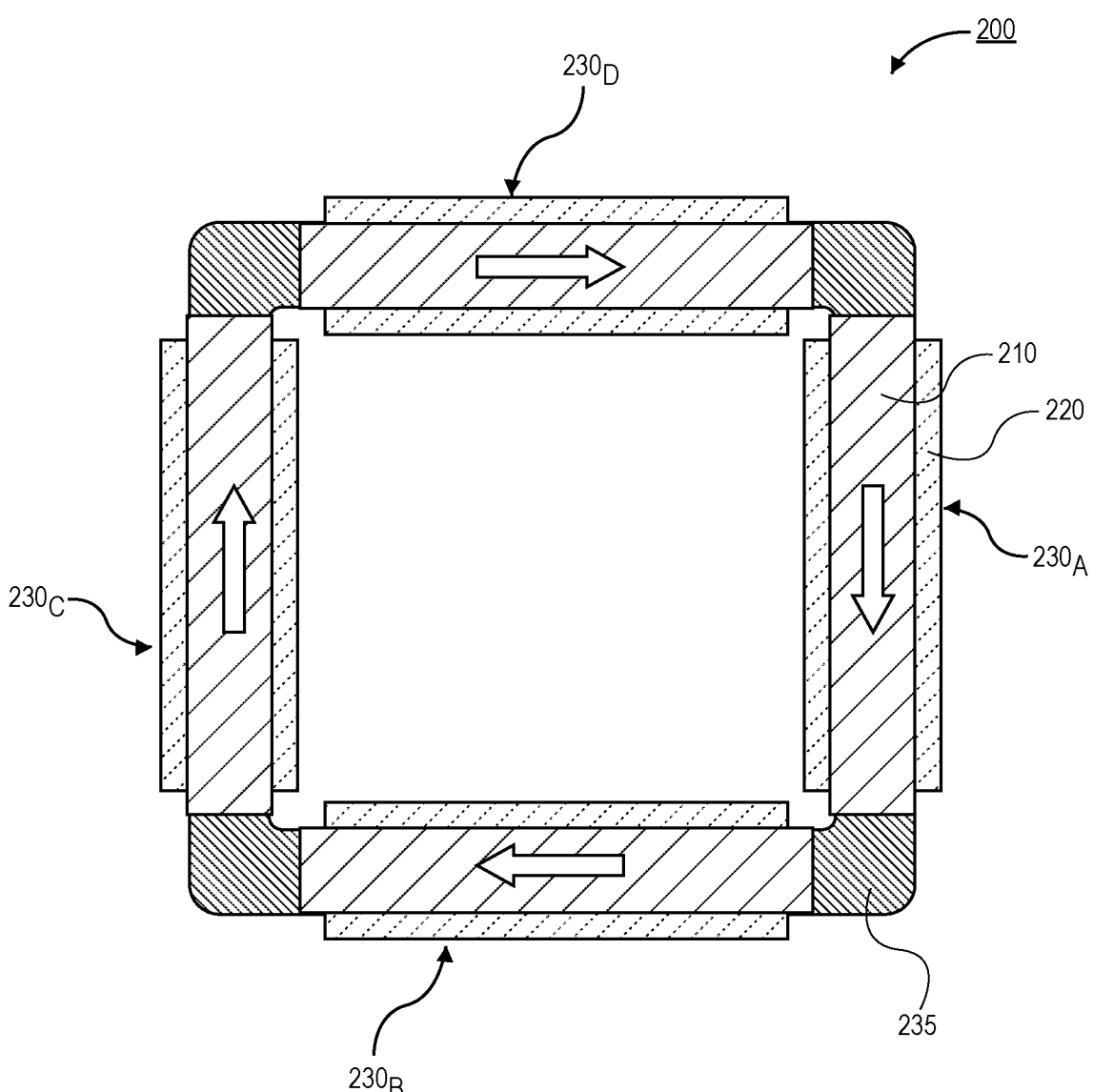
FIG. 2 is a plan view illustration of a toroidal plasma source with a plurality of plasma legs that are coupled together by corner connectors, in accordance with an embodiment.

Referring now to FIG. 2 an illustration of a toroidal remote plasma system 200 is shown, in accordance with an embodiment. As shown, the toroidal remote plasma system 200 comprises a plurality of plasma legs 230. For example, four plasma legs $230_A$-$230_D$ are connected to each other by grounded corner connectors 235. Each of the plasma legs $230_A$-$230_D$ may be substantially similar to the plasma leg 130 described in greater detail above. For example, each plasma leg 230 may include a conductive shell 210 and a magnetic layer 220 around the conductive shell 210.

While not show for simplicity, each plasma leg 230 may also comprise a primary coil to induce plasma in the conductive shell 210. In some embodiments, each of the plasma legs 230 may have an electrically isolated primary coil. As such, the plasma power within each of the plasma legs 230 may be individually controllable. In other embodiments, the primary coils for each of the conductive shells 210 may be electrically connected in parallel. In yet another embodiment, the primary coils for each of the plasma legs 230 may be connected in series. Embodiments may also include a combination of primary coils that are connected in parallel and in series. As shown by the arrows, the primary coils may induce a secondary current within the conductive shells 210. The secondary current in each conductive shell may all be in the same direction. For example, in FIG. 2, the arrows of the secondary current point in a clockwise direction.

It is to be appreciated that a true toroidal plasma may be generated in the remote plasma system 200. That is, the plasma may be generated at the top and bottom legs $230_B$ and $230_D$ in addition to the side legs $230_A$ and $230_C$. This is in contrast to existing so called "toroidal" plasmas that only have plasma generation on the side legs. In such architectures, the top and bottom regions provide fluidic coupling between the side legs, but there are no coils to actively induce plasma at the top and bottom.

Figure 3A:
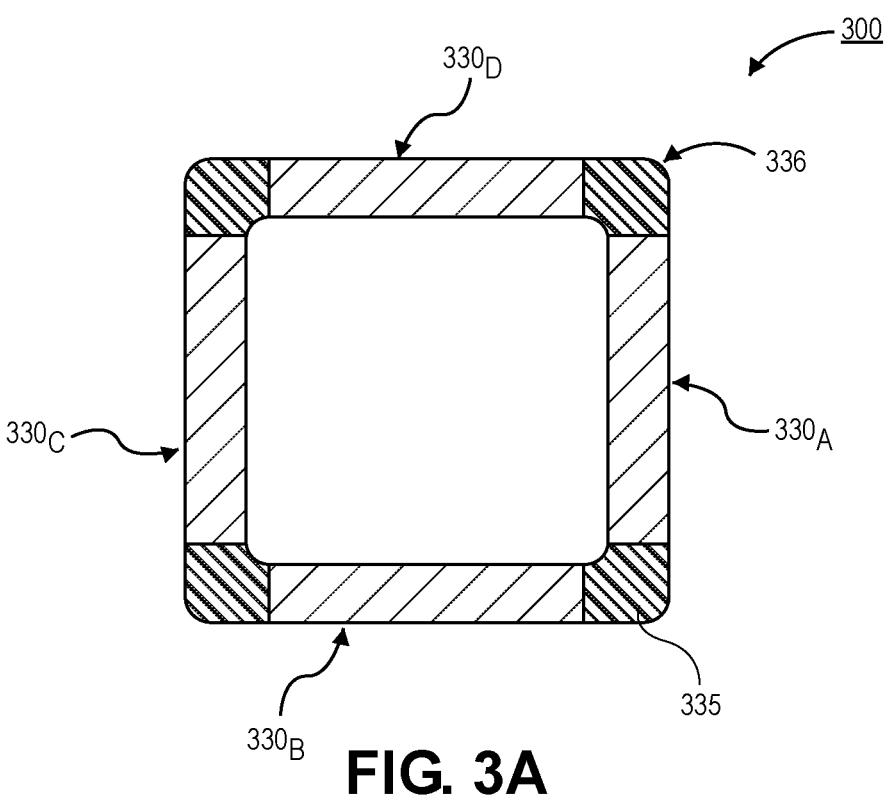
FIG. 3A is a plan view illustration of a toroidal plasma source with a plurality of plasma legs that are coupled together by rounded corner connectors, in accordance with an embodiment.

Referring now to FIG. 3A, an illustration of the toroidal remote plasma system 300 is shown, in accordance with an embodiment. As shown, the remote plasma system 300 comprises a plurality of plasma legs $330_A$-$330_D$ that are coupled together by grounded corner connectors 335. Each plasma leg 330 may be substantially similar to the plasma legs described in greater detail above. For example, each plasma leg 330 may comprise a conductive shell with a magnetic layer around the conductive shell. Primary coils may also be provided around the plasma leg 330 to induce the plasma.

In the illustrated embodiment, the corner connectors 335 are held at a ground potential. In an embodiment, the corner connectors 335 may have rounded corner surfaces 336. The rounded corner surfaces 336 may improve gas flow around the remote plasma system 200. Additionally, rounded corners may result in less damage. As such, the lifespan of the remote plasma system 200 may be improved. However, it is to be appreciated that embodiments are not limited to rounded corners. For example, in FIG. 3B, the grounded corner connectors 335 have sharp corner surfaces 336.

Figure 3B:
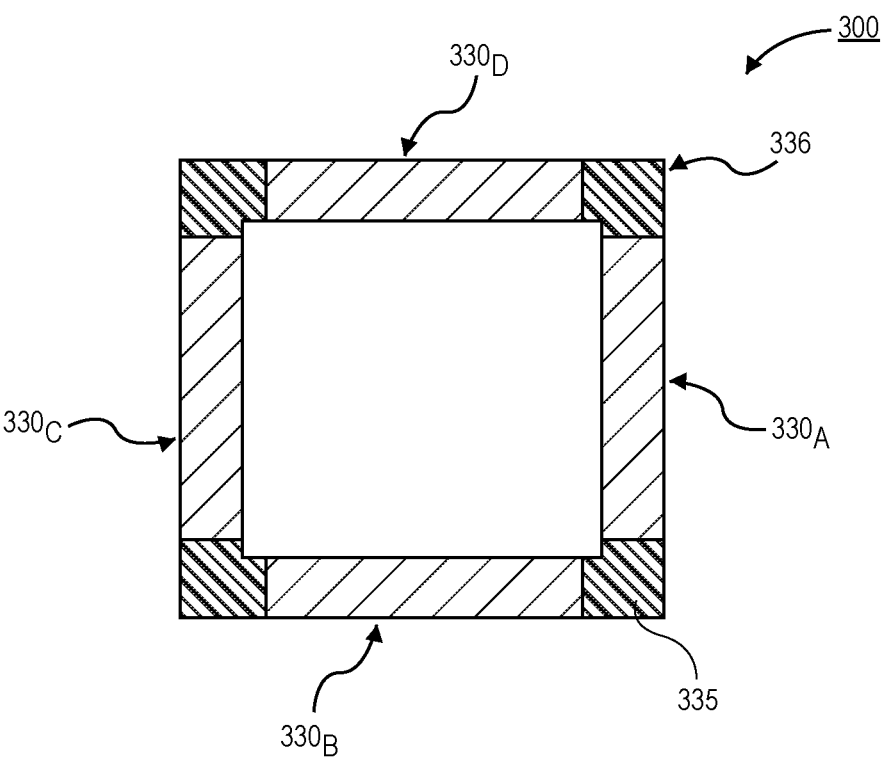
FIG. 3B is a plan view illustration of a toroidal plasma source with a plurality of plasma legs that are coupled together by corner connectors with sharp corners, in accordance with an embodiment.

Referring now to FIG. 3B, an illustration of a remote plasma system 300 is shown, in accordance with an additional embodiment. Similar to the embodiment in FIG. 3A, the remote plasma system 300 comprises a plurality of plasma legs $330_A$-$330_D$ that are coupled together by corner connectors 335. In an embodiment, the corner connectors 335 are configured to be held at a ground potential. However, instead of having rounded corner surfaces 336, the corner surfaces 336 are sharp corners.

Figure 4A:
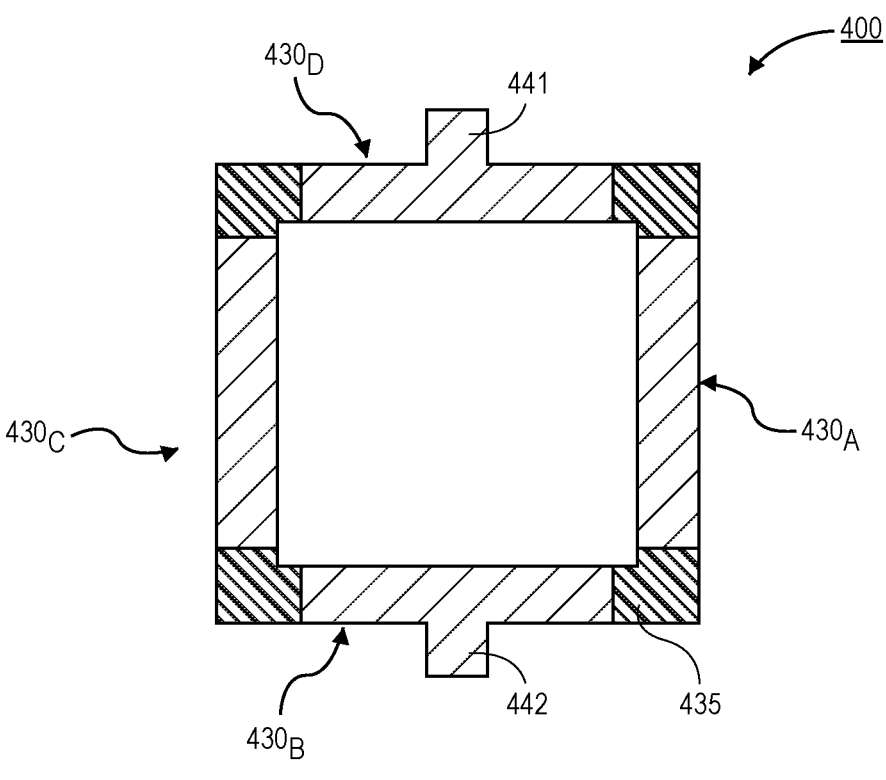
FIG. 4A is a plan view illustration of a toroidal plasma source with a gas inlet and a gas outlet that are coupled to opposite plasma legs, in accordance with an embodiment.

Referring now to FIG. 4A, an illustration of a toroidal remote plasma system 400 is shown, in accordance with an embodiment. In an embodiment, the toroidal remote plasma system 400 may comprise a plurality of plasma legs $430_A$-$430_D$ that are coupled together by connectors 435. In the illustrated embodiment, the connectors 435 may have sharp corners (similar to the embodiment shown in FIG. 3B). In other embodiments, the connectors 435 may have rounded corners (similar to the embodiment shown in FIG. 3A). The connectors 435 may be configured to be held at a ground potential.

In an embodiment, a gas inlet 441 and a gas outlet 442 are coupled to the toroidal remote plasma system 400. In an embodiment, the gas inlet 441 is coupled to the top plasma leg $430_D$, and the gas outlet 442 is coupled to the bottom plasma leg $430_B$. Such coupling allows for a more symmetric flow of gasses through the remote plasma system 400. For example, approximately half of the gas will flow from the top plasma leg $430_D$ to the right plasma leg $430_A$ and to the bottom plasma leg $430_B$, and the other half of the gas will flow from the top plasma leg $430_D$ to the left plasma leg $430_C$ and to the bottom plasma leg $430_B$.

While not shown in FIG. 4A, it is to be appreciated that magnetic layers and primary coils are provided around each of the plasma legs 430. Accordingly, the gas inlet 441 and the gas outlet 442 need to be routed through the magnetic layers and the primary coils in order to access the top plasma leg $430_D$ and the bottom plasma leg $430_B$. Such routing may increase the complexity of the remote plasma system 400.

Figure 4B:
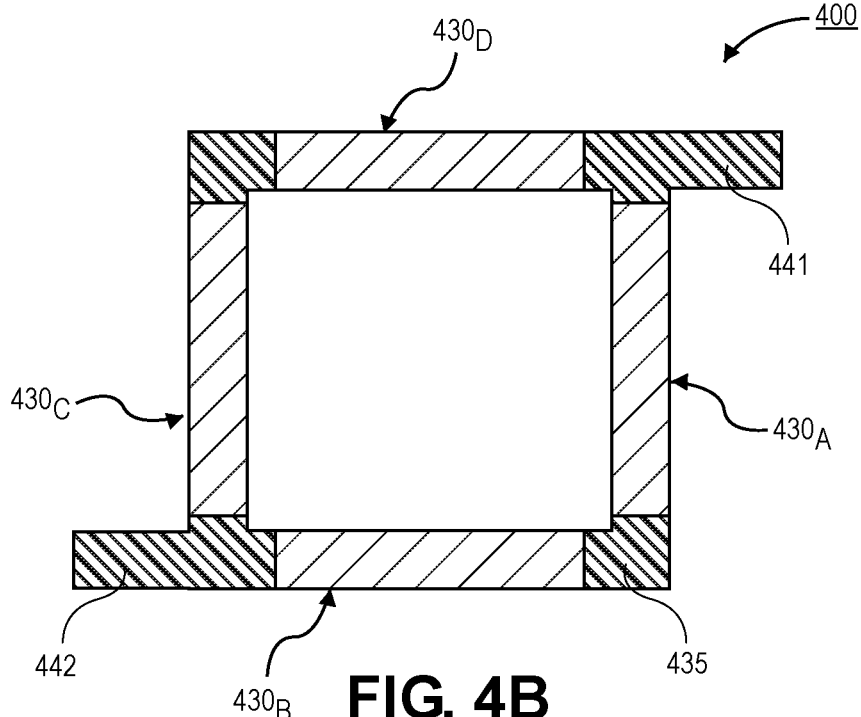
FIG. 4B is a plan view illustration of a toroidal plasma source with a gas inlet and a gas outlet that are coupled to opposite corner connectors, in accordance with an embodiment.

Accordingly, an embodiment where the gas inlet 441 and the gas outlet 442 are coupled to corner connectors 435 is shown in FIG. 4B. Coupling to the corner connectors 435 instead of the plasma legs 430 eliminates the need to pass through the magnetic layers and the primary coils. As such, the construction of the remote plasma system 400 may be simplified compared to the embodiment shown in FIG. 4A.

Figure 5:
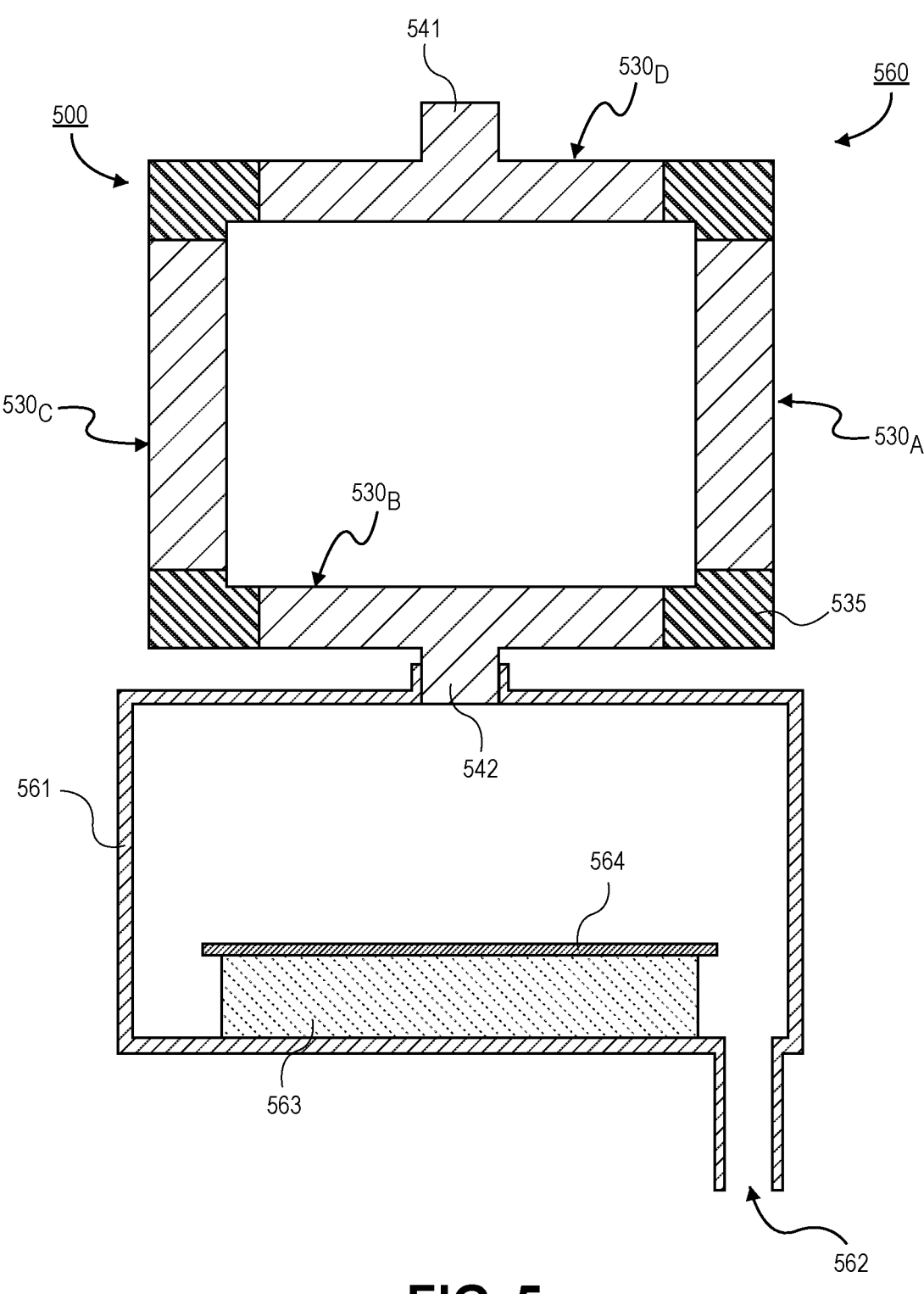
FIG. 5 is a cross-sectional illustration of a processing tool with a toroidal remote plasma system with a plurality of plasma legs that are coupled together by corner connectors, in accordance with an embodiment.

Referring now to FIG. 5, a cross-sectional illustration of a processing tool 560 is shown, in accordance with an embodiment. In an embodiment, the processing tool 560 comprises a processing chamber 561. The processing chamber 561 may be a chamber that is capable of supporting a sub-atmospheric pressure during the processing of substrate 564. The chamber 561 may be fluidically coupled to a pump through an exhaust system 562. In an embodiment, the substrate 564 may be supported and secured by a chuck 563, a pedestal or the like. In an embodiment, the substrate 564 is a semiconductor substrate, such as a silicon wafer or a wafer of another semiconductor material. In other embodiments, the substrate 564 may comprise a glass substrate, an organic substrate, or any other substrate typical of semiconductor manufacturing processes.

In an embodiment, the processing chamber 561 is used as a material deposition chamber. For example, material may be deposited onto a surface of the substrate 564. In an embodiment, the processing chamber 561 is a chemical vapor deposition (CVD) chamber, an atomic layer deposition (ALD) chamber, or a physical vapor deposition (PVD) chamber. In other embodiments, the processing chamber 561 is an etching chamber. That is, material is removed from the surface of the substrate 564. During deposition or etching processes, material may deposit along the interior surfaces of the chamber 561. As such, periodic chamber 561 cleaning may be necessary.

In an embodiment, the chamber cleaning may be implemented with a remote plasma source 500. The remote plasma source 500 may be substantially similar to any of the plasma sources described herein. For example, the plasma source 500 may comprise be a toroidal remote plasma source 500. In such an embodiment, the plasma source 500 may comprise a plurality of plasma legs 530$_A$-530$_D$. Each of the plasma legs 530 may comprise a conductive shell that is surrounded by a magnetic layer and a primary coil for inducing a plasma in the conductive shell. The magnetic layer and the primary coil are omitted from FIG. 5 for simplicity. However, it is to be appreciated that the magnetic layers and the primary coils may be similar to the embodiment shown and described with respect to FIG. 1 above.

In an embodiment, each of the plasma legs 530 may be coupled to each other by corner connectors 535. The corner connectors 535 may be configured to be held at a ground potential in some embodiments. In the illustrated embodiment, the corner connectors have sharp corners. However, in other embodiments, the corner connectors 535 may have rounded corners, similar to the embodiment shown in FIG. 3A.

In an embodiment, the plasma source 500 may comprise a gas inlet 541 and a gas outlet 542. The gas inlet 541 and the gas outlet 542 may be coupled to plasma legs 530, as shown in FIG. 5. In the illustrated embodiment, the gas inlet 541 is coupled to a top plasma leg 530$_D$, and the gas outlet 542 is coupled to a bottom plasma leg 530$_B$. The gas outlet 542 may be fluidically coupled to the chamber 561. The configuration with the gas inlet 541 and the gas outlet 542 on opposite plasma legs 530 may provide a symmetric flow of gasses through the plasma source 500.

However, in other embodiments, the gas inlet 541 and the gas outlet 542 may be coupled to corner connectors 535 instead of the plasma legs. Such an embodiment may be similar to the construction shown in FIG. 4B. Coupling the gas inlet 541 and the gas outlet 542 to the corner connectors 535 may simplify the construction of the plasma source 500 since the gas inlet 541 and the gas outlet 542 do not need to pass through the magnetic layer or primary coil around each of the plasma legs 530.

Figure 6:
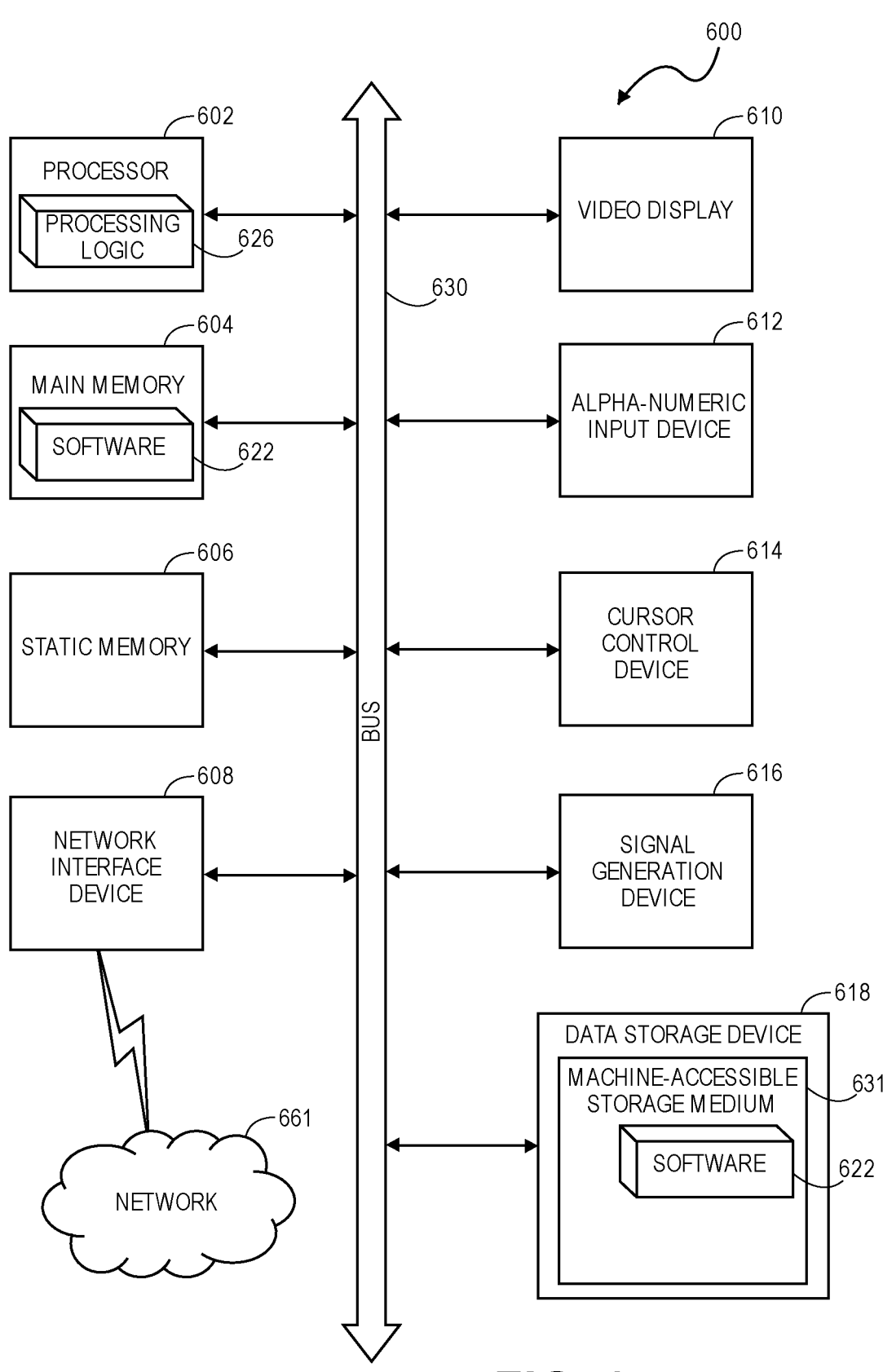
FIG. 6 illustrates a block diagram of an exemplary computer system, in accordance with an embodiment of the present disclosure.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), MRAM, etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, and optical and magnetic media.

In accordance with an embodiment of the present disclosure, a machine-accessible storage medium has instructions stored thereon which cause a data processing system to perform a method of cleaning a processing chamber using a toroidal remote plasma source with a plurality of plasma legs that are coupled together by corner connectors.

Thus, methods for chamber cleaning with a remote plasma have been disclosed.

What is claimed is:

1. A plasma source, comprising:
a plurality of plasma legs connected to each other by corner connectors, wherein the plurality of plasma legs and the corner connectors comprise a top leg above a bottom leg, and a first side leg and a second side leg between the top leg and the bottom leg, the second side leg laterally spaced apart from the first side leg, a first corner connector between the top leg and the first side leg, a second corner connector between the top leg and the second side leg, the second corner connector laterally spaced apart from the first corner connector, a third corner connector between the bottom leg and the first side leg, and a fourth corner connector between the bottom leg and the second side leg, the fourth corner connector laterally spaced apart from the third corner connector, and wherein each plasma leg comprises:
a conductive shell;
a magnetic layer around the conductive shell; and
a primary coil in the magnetic layer, wherein a portion of the primary coil is laterally intervening between a portion of the magnetic layer and the conductive shell.

2. The plasma source of claim 1, wherein each of the primary coils of the plasma legs are electrically isolated from each other.

3. The plasma source of claim 1, wherein each of the primary coils of the plasma legs are connected electrically in series.

4. The plasma source of claim 1, wherein each of the primary coils of the plasma legs are connected electrically in parallel.

5. The plasma source of claim 1, wherein the corner connectors are configured to be at a ground potential.

6. The plasma source of claim 5, wherein the conductive shells are configured to be at a floating potential.

7. The plasma source of claim 1, wherein the corner connectors have a rounded corner surface.

8. The plasma source of claim 1, wherein the corner connectors have a sharp corner surface.

9. The plasma source of claim 1, further comprising:
a gas inlet to the plasma source; and
a gas outlet from the plasma source.

10. The plasma source of claim 9, wherein the gas inlet is coupled to a first plasma leg, and wherein the gas outlet is coupled to a second plasma leg.

11. The plasma source of claim 9, wherein the gas inlet is coupled to a first corner connector, and wherein the gas outlet is coupled to a second corner connector.

12. A toroidal remote plasma source, comprising:
a first plasma leg;
a second plasma leg coupled to the first plasma leg by a first corner connector;
a third plasma leg coupled to the second plasma leg by a second corner connector, the third plasma leg laterally spaced apart from the second plasma leg, and the second corner connector laterally spaced apart from the first corner connector; and
a fourth plasma leg coupled to the third plasma leg by a third corner connector, and wherein the fourth plasma leg is also coupled to the first plasma leg by a fourth corner connector, the fourth corner connector laterally spaced apart from the third corner connector, wherein each plasma leg comprises:
a conductive shell;
a magnetic layer around the conductive shell; and
a primary coil in the magnetic layer, wherein a portion of the primary coil is laterally intervening between a portion of the magnetic layer and the conductive shell.

13. The toroidal remote plasma source of claim 12, wherein each of the primary coils is configured to induce secondary currents within the corresponding plasma legs that are all oriented in the same direction around the toroidal remote plasma source.

14. The toroidal remote plasma source of claim 12, wherein each of the corner connectors has a rounded corner surface.

15. The toroidal remote plasma source of claim 12, further comprising:
a gas inlet; and
a gas outlet.

16. The toroidal remote plasma source of claim 15, wherein the gas inlet is coupled to the first plasma leg, and wherein the gas outlet is coupled to the third plasma leg.

17. A plasma processing tool, comprising:
a chamber; and
a remote plasma source coupled to the chamber, wherein the remote plasma source comprises:
a plurality of plasma legs connected to each other by corner connectors, wherein the plurality of plasma legs and the corner connectors comprise a top leg above a bottom leg, and a first side leg and a second side leg between the top leg and the bottom leg, the second side leg laterally spaced apart from the first side leg, a first corner connector between the top leg and the first side leg, a second corner connector between the top leg and the second side leg, the second corner connector laterally spaced apart from the first corner connector, a third corner connector between the bottom leg and the first side leg, and a fourth corner connector between the bottom leg and the second side leg, the fourth corner connector laterally spaced apart from the third corner connector, and wherein each plasma leg comprises:
a conductive shell;
a magnetic layer around the conductive shell; and a primary coil in the magnetic layer, wherein a portion of the primary coil is laterally intervening between a portion of the magnetic layer and the conductive shell.

18. The plasma processing tool of claim 17, wherein the plurality of plasma legs comprises four plasma legs.

\* \* \* \* \*